United States Patent
Michie et al.

(10) Patent No.: US 7,081,990 B2
(45) Date of Patent: Jul. 25, 2006

(54) VARIABLE-GAIN GAIN-CLAMPED OPTICAL AMPLIFIERS

(75) Inventors: Walter Craig Michie, Killearn (GB); Anthony Edward Kelly, West Kilbride (GB); Andrew Michael Tomlinson, Oxford (GB)

(73) Assignee: Kamelian Limited (GB)

( * ) Notice: Subject to any disclaimer, the term of this patent is extended or adjusted under 35 U.S.C. 154(b) by 0 days.

(21) Appl. No.: 10/489,039

(22) PCT Filed: Sep. 5, 2002

(86) PCT No.: PCT/GB02/04061

§ 371 (c)(1),
(2), (4) Date: Sep. 27, 2004

(87) PCT Pub. No.: WO03/021733

PCT Pub. Date: Mar. 13, 2003

(65) Prior Publication Data

US 2005/0063044 A1  Mar. 24, 2005

(30) Foreign Application Priority Data

Sep. 5, 2001 (GB) ................... 0121466.7
Oct. 1, 2001 (GB) ................... 0123553.0

(51) Int. Cl.
*H01S 3/00* (2006.01)

(52) U.S. Cl. ..................................... 359/344

(58) Field of Classification Search .................. 359/334
See application file for complete search history.

(56) References Cited

U.S. PATENT DOCUMENTS

| | | | |
|---|---|---|---|
| 3,467,906 A | 9/1969 | Cornely et al. | 330/4.3 |
| 5,436,759 A | 7/1995 | Dijaili et al. | 359/333 |
| 5,654,822 A | 8/1997 | Ducellier et al. | 359/344 |
| 5,748,653 A | 5/1998 | Parker et al. | 372/8 |
| 5,991,068 A | 11/1999 | Massicott et al. | 359/337 |
| 6,249,373 B1 | 6/2001 | Woodward | 359/344 |
| 6,366,382 B1 | 4/2002 | Morthier et al. | 359/179 |
| 6,560,010 B1 * | 5/2003 | DiJaili et al. | 359/344 |
| 6,563,631 B1 * | 5/2003 | Delprat et al. | 359/344 |
| 6,766,072 B1 * | 7/2004 | Marazzi et al. | 385/14 |
| 6,891,664 B1 * | 5/2005 | DiJaili et al. | 359/344 |
| 2001/0050794 A1 | 12/2001 | Brindel et al. | 359/176 |

FOREIGN PATENT DOCUMENTS

| | | |
|---|---|---|
| EP | 0 305 995 A2 | 3/1989 |
| EP | 0 639 876 A1 | 8/1994 |
| JP | H10-17838 | 1/1998 |
| WO | WO 01/24329 A1 | 4/2001 |

* cited by examiner

Primary Examiner—Deandra M. Hughes
(74) Attorney, Agent, or Firm—Sierra Patent Group, Ltd.

(57) ABSTRACT

An optical amplifier is disclosed comprising a signal semiconductor optical amplifier having a waveguide, forming at least part of a signal path between an input and an output, extending along a signal active region for amplification of a signal. The amplifier also includes a control active region of semiconductor material having a gain which is controllable independently from the gain of the signal active region. The amplifier also includes a laser cavity containing both the signal active region and the control active region and being capable of clamping the gain of the signal active region, and the control active region is arranged not to amplify a signal in the signal path within a predetermined signal band.

30 Claims, 8 Drawing Sheets

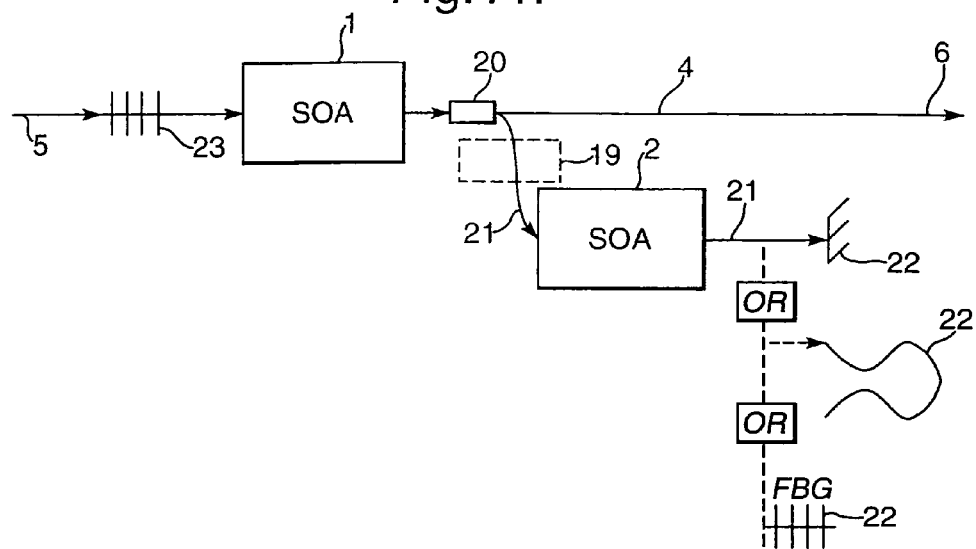
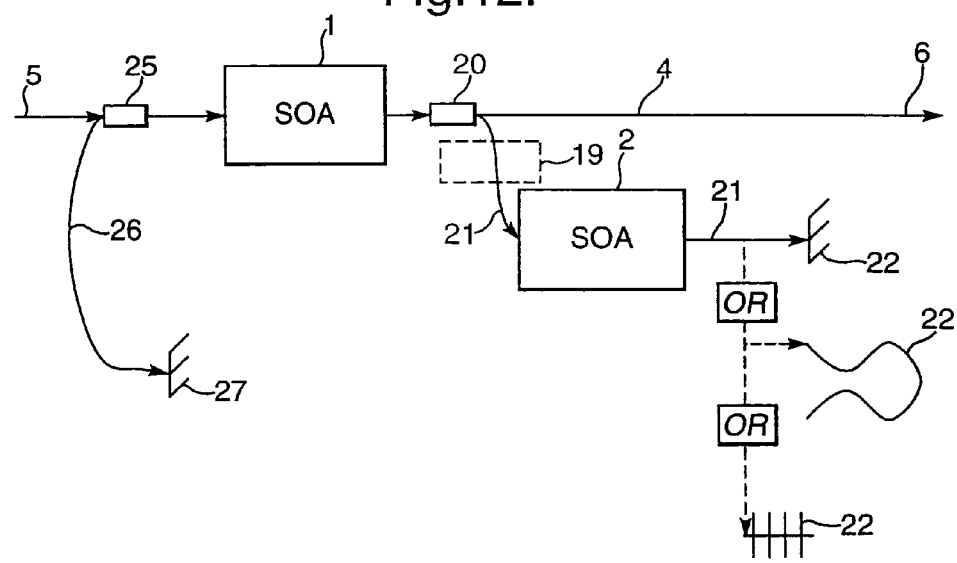

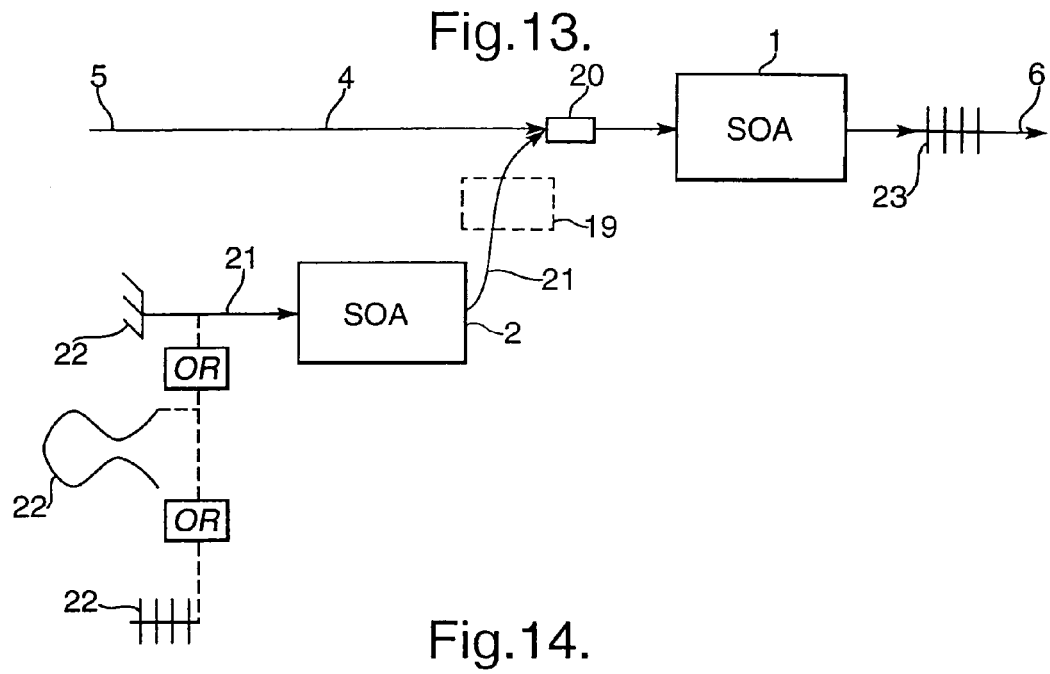
Fig. 13.
Fig. 14.
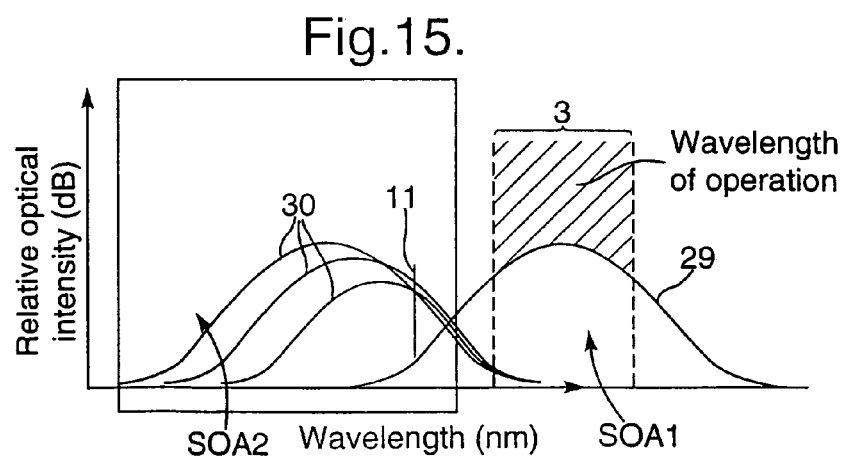
Fig. 15.

VARIABLE-GAIN GAIN-CLAMPED OPTICAL AMPLIFIERS

PRIORITY CLAIMS

This application claims priority to GB 0121466.7 filed on Sep. 5, 2001, GB 0123553.0 filed on Oct. 1, 2001, and the United States was timely specified as an Elected Country in the PCT application no. PCT/GB02/04061, filed Sep. 5, 2002, under 35 U.S.C. 119 which is explicitly incorporated by reference as if set forth below.

BACKGROUND

The present invention relates to optical amplifiers using semiconductor optical amplifiers (SOAs) to amplify an optical signal. Such SOAs have wide applications in telecommunication networks as low-cost linear amplifiers for optical data signals. In particular the present invention relates to the use of a laser cavity to provide gain-clamping for increasing the linear region of operation and hence reducing interference noise.

Operation of a SOA outside the linear region of operation causes non-linear distortion and interference noise. In particular, at high output powers the gain reduces. Such gain modulation can cause non-linear distortion and interference noise in the time domain, that is inter-symbol interference, because the gain recovery time of a SOA is typically similar to the data modulation speed. Similarly, such gain modulation can cause interference noise in the frequency domain, that is inter-channel crosstalk between different frequency channels.

Gain-clamping using a laser cavity is a known technique to reduce gain modulation and the associated interference noise. Typically a laser cavity containing the active material of the SOA is provided to lase at a wavelength outside the desired signal band. In one known arrangement, wavelength dependant reflectors are arranged before and after the SOA to form a laser cavity longitudinally along the signal path. In another arrangement disclosed in U.S. Pat. No. 5,436,759, distributed Bragg reflectors are arranged to form a laser cavity extending vertically, that is perpendicular to the signal propagation axis and the layered structure of the SOA.

The lasing action in the laser cavity clamps the gain of the active material at the laser threshold. A clamped gain is therefore imposed on the amplification of signals in the signal band. By clamping the gain at a level below the normal unclamped gain, the linear region is extended to higher output powers. In particular, the linear region is extended to the saturation output power which, for a given bias current, has a higher level at the lower, clamped gain than at the higher, unclamped gain. This reduces the gain modulation and interference noise.

Gain clamping occurs at the expense of gain variability in that the gain is clamped at a value fixed at the point of manufacture. However it would be desirable provide a gain-clamped SOA for which the level of the clamped gain is controllable in use. There are many situations in telecommunications where this is desirable, for example to allow control the noise figure for the SOA which increases as the gain and hence the carrier density is reduced. Control of the clamped gain is also important in applications such as channel equalization and automatic power control. Automatic power control is becoming increasingly important within optical receivers to optimize the signal strength at the detector, particularly at data rates in excess of 10 GHz where automatic power control in the electronic domain can be prohibitively expensive.

The gain of a SOA which is not gain-clamped can be controlled by changing the bias current supplied to the SOA. However if the bias current is lowered to lower the gain, the saturation output power and hence the linear region also reduces. This contrasts with clamping the gain to a lower level using a laser cavity, in which case the saturation output power is increased at a given bias current, as explained above. What would be desirable is to provide for gain-clamping with variability of the gain at which clamping occurs so as to maximize the saturation output power.

According to the present invention, there is provided an optical amplifier comprising: a signal semiconductor optical amplifier having a waveguide forming at least part of a signal path between an input and an output, extending along a signal active region for amplification of a signal; a control active region of semiconductor material having a gain which is controllable independently from the gain of the signal active region; and a laser cavity containing both the signal active region and the control active region and being capable of clamping the gain of the signal active region, wherein the control active region is arranged not to amplify a signal in the signal path within a predetermined signal band.

In use, the signal active region amplifies the signal in a predetermined signal band passing along the signal path. The laser cavity fixes the total gain of both active regions because they are both contained in the laser cavity. The total gain is clamped at the laser threshold for the laser cavity, that is where the total gain is equal to the losses of the laser cavity, this being inherent in the lasing action.

In use, this arrangement allows the gain of the signal active region to be varied by controlling the gain of the control active region, for example by controlling the bias current supplied to the control active region. As the total gain within the lasing mode is limited to the loss within the cavity, changing the gain of the control active region causes an opposite change in the gain of the signal active region at the wavelength of the lasing mode. Thus a changed clamped gain is also imposed on the amplification of signals in the predetermined signal band which pass in the signal path through the signal active region.

Furthermore, as the control active region does not amplify a signal in the signal path within a predetermined signal band, it is possible to change the bias current to the control active region, or otherwise change the gain of the control active region, without changing the bias current supplied to the signal active region. Thus, the optical amplifier in accordance with the present invention allows signals to be amplified by the signal active region at a clamped gain which is variable by control of the control active region, so maximizing the saturation output power and hence the linear range.

Although the saturation output power of the control active region is changed, this has no effect on the saturation output power of the signal active region.

It is not necessary to change the bias current to the signal active region, although it is in principle possible to do so. Preferably, the signal active region is supplied with a maximum bias current in order to maximize the saturated output power for the signal channel.

Preferably, the laser cavity has a lasing mode at a wavelength outside the predetermined signal band. This is desirable to reduce the effect of the lasing mode on the signal passing through the signal active region, given that the lasing mode also propagates through the signal active region.

To control the wavelength of the lasing mode, the laser cavity may include a wavelength-dependent element, for example, a filter in the lasing cavity outside the signal path or a wavelength-selective coupler within the laser cavity, or wavelength-dependent reflectors to terminate the laser cavity.

The present may be embodied by several different types of optical amplifier.

In a first type of embodiment the control active region is the active region of a control SOA formed in a separate semiconductor chip from the signal SOA. This type of embodiment allows the optical amplifier to be constructed from optical components which, in themselves, are of known construction.

In a second type of embodiment, the signal active region and the control active region are different portions of the same semiconductor chip with the waveguide extending along both the signal active region and the control active region. This may be achieved, for example by at least one of the electrodes of the signal and control active regions being electrically isolated between the signal and the control active regions. One benefit of this arrangement is that it allows the entire optical amplifier to be integrated in a single semiconductor chip. Apart from the electrode configuration, the signal and control active region may in themselves have a conventional construction for an SOA. This allows the present invention to be easily applied to known SOA constructions. It results in an SOA having fundamentally the same properties as a known construction of SOA, but with a variable clamped gain.

In a third type of embodiment, the control active region is integrated outside the waveguide in the same semiconductor chip as the signal semiconductor optical amplifier. In a simple arrangement, the laser cavity extends transversely to the waveguide, preferably perpendicular to the layered structure of the semiconductor chip. This allows the signal and control active regions to be formed by respective layers of active material. In itself the laser cavity may have the construction of a known VCSEL (Vertical Cavity Surface Emitting Laser). This allows the provision of a relatively short laser cavity which provides several advantages including a quick response time. This type of embodiment also provides the advantage that the entire variable-gain-clamped optical amplifier may be integrated in a single semiconductor chip. Furthermore, the provision of the active regions as separate layers provide a high degree over of control over the characteristics and properties of the two active regions.

Two different techniques are used to prevent the control active region from amplifying a signal passing through the signal active region.

The first technique is for the control active region to be outside the signal path so that is does not amplify a signal in the signal path. This is intrinsic in the third type of embodiment. It may be implemented in the first type of embodiment by forming part of the laser cavity an optical path which is outside the signal path and in which the control active region is arranged. To couple that optical path into the signal path, in particular to the portion of the signal path containing the signal active region, one or more optical couplers may be provided in the signal path. The optical coupler(s) may be of any suitable form.

One preferred form is to use a wavelength-selective coupler such as a wavelength division multiplexing (WDM) coupler. This is preferred as the lowest loss implementation because the power of the signal path is not lost by being coupled into the laser cavity. The use of such a wavelength-selective coupler on the output side of the signal SOA also has the advantage that it prevents any transmission of the lasing mode onto the signal path towards the output of the optical amplifier.

As an alternative, the optical coupler(s) may be a wavelength-insensitive coupler such as a weighted beam splitter which splits (or combines) light at all wavelengths in a predetermined ratio. Such an arrangement is lossy, because some of the lasing mode is coupled into the signal path outside the laser cavity and some of the signal is coupled into the laser cavity, but may nonetheless be acceptable if there is sufficient gain in the lasing path. There is a cost-benefit in that wavelength-insensitive couplers are less expensive.

Various configurations for the laser cavity may be used. One simple configuration is a ring laser cavity in which the optical circuit provides a ring-shaped cavity around which the laser mode propagates. In this case, the laser cavity may include an isolator, or other directional element, to control the propagation direction of the lasing mode to be co-directional or counter-directional with respect to the signal path. Alternatively, the laser cavity may contain no directional elements to allow the lasing mode to propagate in both directions around the ring laser cavity. Control of the directionality of the laser cavity with respect to the signal path allows the optical power density to be equalized along the signal path and also gives control over the amount of amplified spontaneous emission (ASE) that is transmitted in the forward direction on the signal path.

To couple the ring laser into the signal path, the optical circuit may include a pair of optical couplers in the signal path on the input side and output side, respectively, of the signal semiconductor optical amplifier. In this case, the pair of optical couplers may couple respective ends of an optical path which contains the control semiconductor optical amplifier and which, together with the portion of the signal path between the pair of optical couplers, forms the ring laser cavity.

Another configuration for the laser cavity is a linear laser cavity in which the lasing mode is reflected at either end of the cavity to propagate back and forth. To couple the linear laser cavity into the signal path the optical circuit may include an optical coupler in the signal path. In this case, the optical coupler may couple an end of an optical path which contains the control semiconductor optical amplifier and which is terminated by a reflector to form one end of the linear laser cavity. The optical path containing the control SOA therefore forms part of the laser cavity, together with a portion of the signal path extending from the optical coupler and containing the signal SOA.

The other end of the linear laser cavity is preferably terminated by a reflector, such as a Bragg reflector, arranged in the signal path, although it is possible to terminate the laser cavity by a reflector arranged outside the signal path and coupled into the signal path by a second optical coupler.

The second technique to prevent the control active region from amplifying a signal passing along the signal path the control semiconductor optical amplifier has an insignificant gain in the predetermined signal band so that it does not amplify a signal in the predetermined signal band. This allows the control semiconductor optical amplifier to be arranged in the signal path which is beneficial because it allows for the optical amplifier to have a simpler construction. For example, the laser cavity may be terminated by reflectors arranged in the signal path outside the control and signal SOAs. The second technique is intrinsic in the second type of embodiment. However the second technique may be applied in combination with a first technique to particular advantage.

With the second technique, the control active region has a significant gain at the wavelength of the lasing mode, but an insignificant gain in the predetermined signal band. This may be achieved by selection of the gain profile of the control active region with respect to the gain profile of the signal active region which will be significant, and usually peak near the predetermined signal band. In particular, this may be achieved by providing the gain profile of the control active region to overlap with the gain profile of the signal active region at the wavelength of the lasing mode.

To allow better understanding, embodiments of the present invention will now be described by way of non-limitative example. With reference to the accompanying drawings, in which:

DESCRIPTION OF THE DRAWINGS

FIGS. 7 to 13 are diagrams of optical amplifiers employing a linear cavity;

FIG. 14 is a diagram of an optical amplifier in which the control SOA is in the optical path;

FIG. 15 is a graph of the gain profile of the signal and control SOAs in the optical amplifier of FIG. 14;

The various embodiments described below share a number of common elements which perform the same function in each embodiment. To avoid repetition, such common elements are referred to using the same reference numerals and a description thereof is not repeated.

DETAILED DESCRIPTION

Firstly, embodiments of a first type will be described in which the optical amplifier of the invention comprises a signal SOA 1 and a control SOA 2 arranged in an optical circuit.

The signal and control SOAs 1, 2 may be any known form of SOA having a waveguide which passes light through active material which amplifies the light. In this type of embodiment, the active semiconductor material of the signal and control SOAs 1, 2 arranged along the waveguides of the signal and control SOAs 1, 2 constitutes the signal and control active regions respectively. SOAs 1, 2 are referred to by the labels "signal" and "control" to distinguish between them, but may be the same type of device. A suitable semiconductor optical amplifier is described in WO-96/41405.

Figure 1:
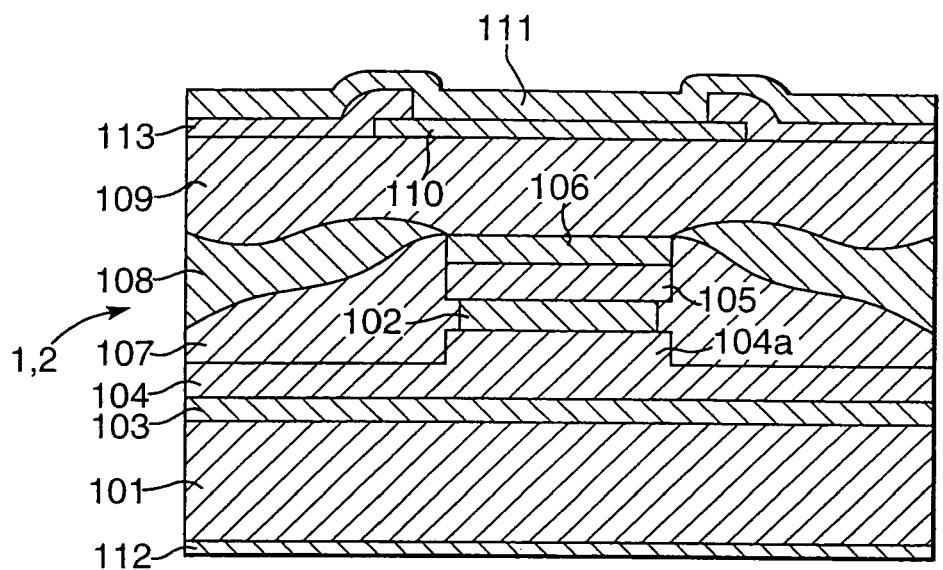
FIG. 1 is a cross-sectional view of an SOA, the cross-section being taken across the SOA perpendicular to the optical axis.

Another suitable structure for the control and signal SOA 1, 2 suitable for use within telecommunications networks, will now be described with reference to FIG. 1. FIG. 1 is a cross-sectional view across the active region of the SOA 1, 2, perpendicular to the optical axis.

The SOA 1, 2 is formed as a single semiconductor wafer having a crystalline structure of semiconductor materials. Further SOAs may be formed in the same wafer. The base materials are In and P to provide a gain characteristic centered nearer the 1550 nm band of channels, but alternatively other semiconductor materials could be used. The SOA 1, 2 has a layered construction of successive layers and may be manufactured by a deposition process such as MOCVD (metalorganic chemical vapor deposition) or MBE (molecular beam epitaxy) together with lithographic techniques, such manufacture being in itself conventual. The growth may be performed to provide each layer with the necessary physical characteristics and also to allow accurate control of the thickness of each layer. The layers will now be described in more detail.

A substrate 101 of base material InP is provided with a greater thickness than the other layers to impose a crystal lattice on those other layers.

Above the substrate 101, the SOA 1, 2 has a waveguide structure comprising a active layer 102 constituted by active semiconductor material, that is InGaPAs in appropriate proportions. The active layer 102 have a width less than that of the substrate 101 and is surrounded by various layers of material, typically InP, having a lower refractive index than the active layer 102 to create optical confinement of light within the active layer 102 which therefore act as a waveguide. The active layer 102 has suitable dimensions to support a single mode in its operating frequency band.

Between the substrate 101 and the active layer 102, the SOA 1, 2 has a buffer layer 103 of n-type InP adjacent the substrate 101 and a lower cladding layer 104 of InP. The lower cladding layer 104 is stepped to provide a protruding portion 104a of substantially the same width as the active layer 102 and on which the active layer 102 is formed.

Above the active layer 102, the SOA 1, 2 has an upper cladding layer 105 of InP adjacent the active waveguide 102 and a cap layer 106 of p-type InP. Both the upper cladding layer 105 and the cap layer 106 are of substantially the same width as the active layer 102.

Although the active layer 102 is of substantially the same width as the adjacent lower and upper cladding layers 104, 105, and the active layer 102 is preferably notch-etched during manufacture which is a conventional technique to remove surface defects. Such notch-etching slightly reduces the width of the active layer 102 so that the adjacent layers overhang.

The SOA 1, 2 further has a first current blocking layer 107 of n-type InP provided above the lower cladding layer 104 and covering the sides of the active waveguide 102 and the upper cladding layer 105 and extending at least partially over the sides of the cap layer 106, preferably to the upper surface of the cap layer 106. A second current blocking layer 108 of p-type InP covers the first current blocking layer 107.

The second current blocking layer 108 and the cap layer 106 are covered by an overgrowth layer 109 of InP. On the upper surface of the overgrowth layer 109, a contact layer 110 of InGaAs is provided.

The SOA 1, 2 has an upper contact 111 in electrical contact with the contact layer 110 and a lower contact 112 in electrical contact with the substrate 101. The upper and lower contacts 111 and 112 are made of metal, such as gold.

For electrical isolation, an insulator layer 113 is provided extending across the upper surface of the overgrowth layer 113. The insulator layer 113 extends under the upper contact 111 overlapping the edges of the contact layer 110. Thus the upper contact 111 contacts the contact layer 110 in a window between the edges of the insulator layer 113.

In use, a drive current is passed between the upper contact 111 and the lower contact 112. The drive current pumps the material of the active layer 102 which therefore amplifies the light passing along the active waveguide formed by the active layer 102. The SOA 1, 2 may have the structure illustrated in FIG. 1 along its entire length, although other more complicated structures are possible. The end facets of the SOA 1, 2 are arranged to have a very low reflection, typically of the order of $10^{-3}$ or $10^{-4}$, for example by being formed with anti-reflection coatings.

The described embodiments all have a single signal SOA 1 and a single control SOA 2, but in principle nay number of signal SOAs and any number of control SOAs could be provided in series or parallel with each other.

Figure 2:
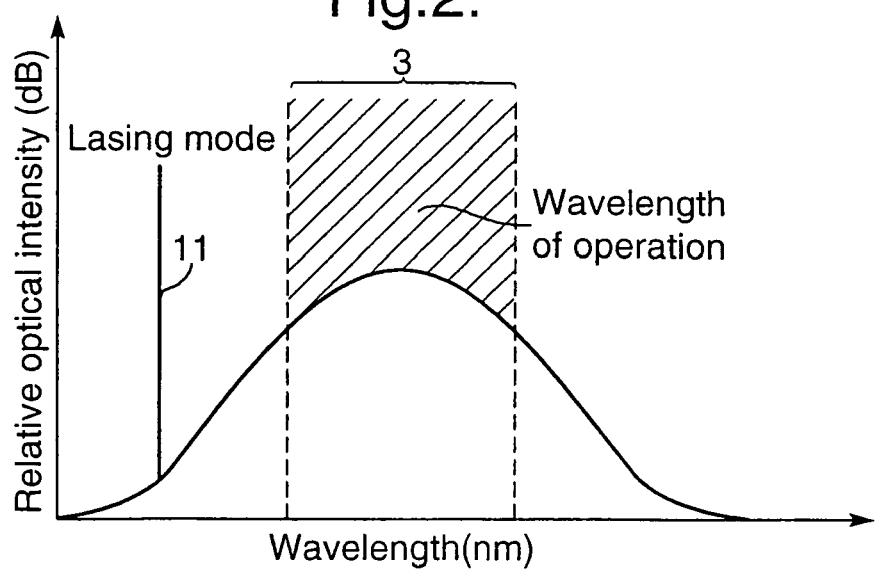
FIG. 2 is a graph of the gain profile of a signal SOA.

In use, the active material of the signal SOA 1 amplifies signals in a desired signal band carrying data within a telecommunications network. FIG. 2 illustrates a typical gain profile for the signal SOA 1 and is a graph of relative optical density (dB) against wavelength (nm). Thus signal SOA 1 has a gain profile which peaks within the desired signal band 3.

The optical paths of the respective optical circuits are formed by passive waveguiding structures formed in separate elements from the signal SOA 1 and the control SOA 2, such as silica-on-silicon, silicon or polymer waveguides which are readily commercially available. This allows all the elements of the optical amplifier, including the signal SOA 1 and the control SOA 2, the waveguides and the other elements of the optical amplifier, to be mounted in an integral form on a common microbench to provide the optical amplifier as a single module. However, this is not essential and the optical paths may be formed by waveguides of any suitable form, such as optical fibers coupled between the various elements.

Thus, the embodiments of the first type may be constructed from optical elements including the signal and control SOAs 1, 2, which are in themselves of known construction. This allows the present invention to be implemented in a convenient manner using readily available components. That being said, the optical circuits could be integrated into a single semiconductor chip in which case the optical paths are waveguides formed within the semiconductor by conventional manufacturing techniques such as epitaxy.

The control SOA 2 does not amplify the signal in the signal band 3. This may be achieved using two alternative techniques. The first technique is for the control SOA 2 to be outside the signal path. The second technique is for the control SOA 2 to have an insignificant gain in the predetermined signal band in which case the control SOA may be in the signal path. Embodiments using the first technique will now be described. In each of the following embodiments, the second technique of providing the control SOA 2 to have an insignificant gain in the predetermined signal band may be used to particular advantage in combination with the first technique of providing a control SOA 2 outside the signal path.

Figure 3:
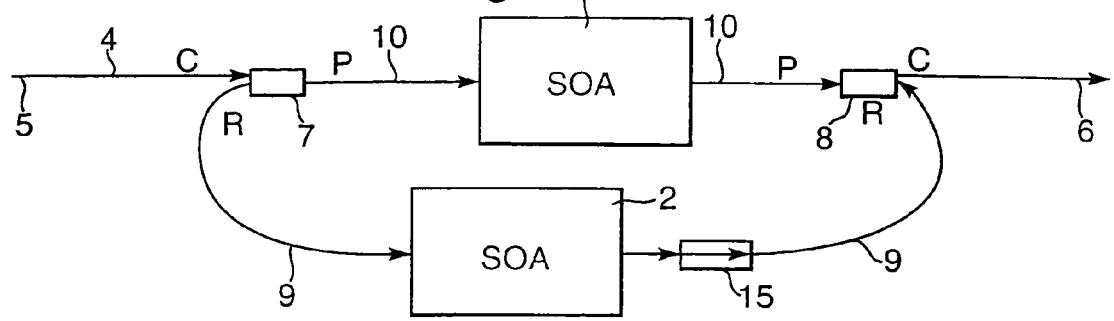
FIG. 3 is a diagram of an optical amplifier employing a ring laser cavity.

FIG. 3 illustrates an optical amplifier in which the signal SOA 1 and the control SOA 2 are arranged in an optical circuit including a ring laser cavity containing both the signal SOA 1 and the control SOA 2. The signal SOA 1 is arranged in a signal path 4 between an input 5 and an output 6. Optical couplers 7 and 8 are arranged in the signal path 4 on opposite sides of the signal SOA 1. The optical couplers 7 and 8 couple an optical path 9 containing the control SOA 2 into the signal path 4 to form a ring cavity consisting of both the optical path 9 and the portion 10 of the signal path 4 between the optical couplers 7 and 8. Thus the optical couplers 7 and 8 couple between, on one hand, the portion 10 of the signal path 4 between the optical couplers 7 and 8 and, on the other hand, both the remainder of the signal path 4 outside the ring cavity and optical path 9.

The ring cavity is arranged to lase at a wavelength outside the signal band 3. For example, FIG. 2 illustrates a typical lasing mode 11 on the gain profile of the signal SOA 1 adjacent the signal band 3. By providing the lasing mode 11 outside the signal band 3, the lasing mode 11 may be removed from the signal transmitted to the output 6, for example by filtering or by the optical coupler 8 on the output side of the signal SOA 1 being wavelength-selective, as further described below.

Figure 4:
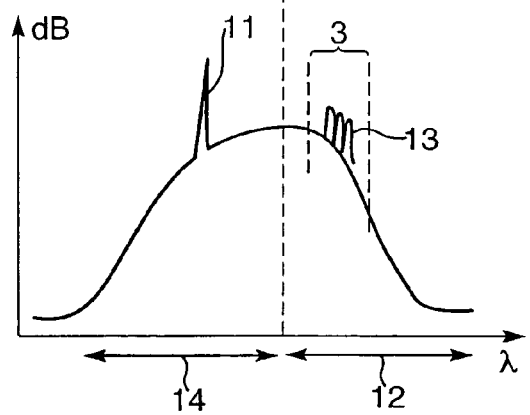
FIG. 4 is a graph illustrating the multiplexing bands of a WDM coupler.

In general, the wavelength of the lasing mode 11 may be controlled by any wavelength-dependent element in the laser cavity. However, in the optical amplifier of FIG. 2, the wavelength-dependent elements are the optical couplers 7 and 8 which are wave division multiplexing (WDM) couplers or other wavelength-selective couplers. In particular, the optical couplers 7 and 8 multiplex together (i) light at the wavelength of the lasing mode on optical path 9 and (ii) light in the signal band 3 on the remainder of the signal path 4 outside the ring cavity. The multiplexed light is coupled to the portion 10 of the signal path 4 between the optical couplers 7 and 8. For example, FIG. 4 illustrates the power spectrum for the channels of the optical couplers 7 and 8, being a graph of relative power intensity (db) of the light on the portion 10 of the signal path 4 within the ring cavity against wavelength (nm). The pass band 12 of the optical couplers 7 and 8 is arranged to contain the signal band 3 including data 13 and is coupled to the remainder of the signal path 4 outside the ring cavity. The reflect band 14 is arranged to contain the lasing mode 11 and is coupled to the remainder of the optical path 4 outside the ring cavity.

An isolator 15 is provided in the optical path 9 outside the signal path 4. The isolator 15 controls the propagation direction of the lasing mode in the ring cavity to be counter-directional with respect to the forward direction along the signal path 4 between the input 5 and the output 6. This is beneficial because it reduces the amount of ASE transmitted in the forward direction along the signal path 4.

Data in the signal band 3 passes along the signal path through the signal SOA 1 only once due to the action of the optical couplers 7 and 8. Wavelengths that are outside the signal band 3 are passed by the WDM couplers 7 and 8 around the ring cavity many times, the number of passes being dictated by net gain of the ring cavity. This light forms the lasing mode. The ring cavity can lase at any wavelength passed by the optical couplers 7 and 8, but in practice the wavelength of the lasing mode will be where the gain is greatest (or the loss is lowest), for example at the wavelength where the reflect band of the optical couplers 7 and 8 intersects with the overall gain profile of the SOAs 1 and 2.

In use, the lasing action clamps the total gain of the signal SOA 1 and the control SOA 2 at that gain where the lasing threshold is reached, in other words where the total gain equals the total losses of the laser cavity. Thus the gain of the signal SOA 1 in the signal band is also clamped.

In use, the gain of the control SOA 2 is controlled. This may be done by controlling the drive current supplied to the control SOA 2.

Alternatively the gain of the control SOA 2 may be controlled thermally. To achieve this the control SOA 2 is provided with resistive paths which heat the active material of the control SOA 2 when a current is passed. The substrate of the control SOA 2 effectively acts as a heat sink at a constant temperature. Therefore the temperature of the active material of the control SOA 2 is controlled by passing a current through the resistive paths and varying the level of the current.

As a consequence of varying the gain of the control SOA 2, the lasing action of the laser cavity causes the clamped gain of the signal SOA 1 at the lasing wavelength to vary oppositely to the gain of the control SOA 2 so that the total gain of both SOAs 1 and 2 remains constant. Thus, the clamped gain of the signal SOA 1 imposed on amplification of signals in the signal band passing along the signal path 4 is also varied. In other words, control of the control SOA 2 allows the clamped gain of the signal SOA 1 in the signal band to be varied without variation of the bias current supplied to the signal SOA 1. This maximizes the saturation output power of the signal SOA 1, as compared to a corresponding change in gain achieved by varying the bias current. Although changing the bias current of the control SOA 2 affects the saturation output of the control SOA 2, this does not limit the saturation output power of the signal SOA 1. In normal use, the bias current supplied to the signal SOA 1 is fixed, usually at its maximum value in order to maximize the saturation output power.

In fact, the gain of the signal SOA 1 may even be varied into loss by controlling the bias current of the control SOA 2 to raise the gain of the control SOA 2 above the laser threshold of the laser cavity. This is advantageous because there are many circumstances in a telecommunications network when it is desirable to reduce the level of a data signal, for example to bring it within the operating conditions of a particular device. However such a linear reduction in power is not possible with a simple SOA.

Figure 5:
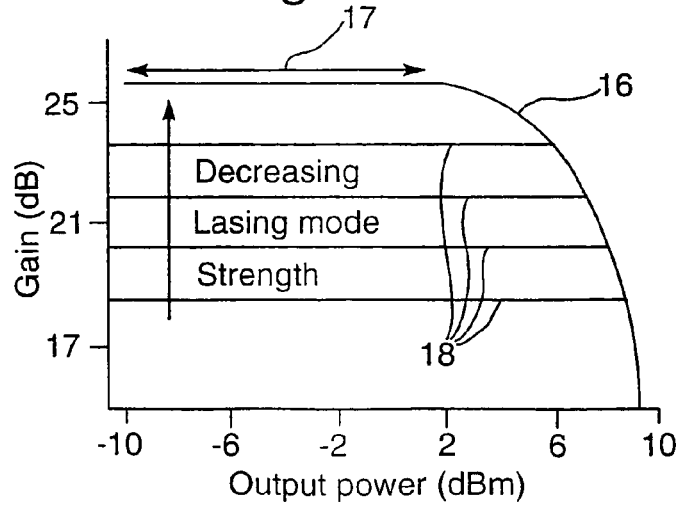
FIG. 5 is a graph of the gain characteristic for gain-clamped optical amplifiers in accordance with the present invention.

As an example, FIG. 5 shows the gain characteristic and is a graph of the gain (dB) of the signal SOA 1 against output power (dBm). The gain of the control SOA 2 if it were not gain-clamped is illustrated by the line 16 and has a linear region 17 extending up to the saturation output power above which the gain drops. The clamped gain of the signal SOA 1 for different bias currents of the control SOA 2 is shown by the lines 18. The clamped gain 18 is lower than the linear region 17 of the un-clamped gain 16. The clamped gain 18 for any given bias current of the control SOA 2 is linear up to the saturation output power of the signal SOA 1 which occurs at a higher value than the saturation output power for the un-clamped gain 16.

Figure 6:
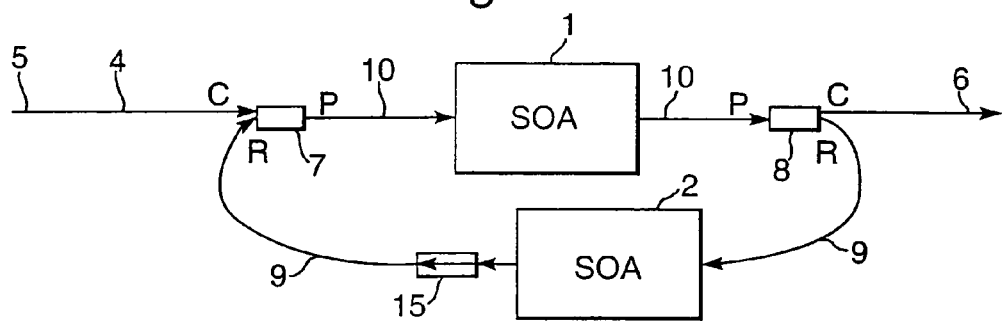
FIGS. 6 to 8 are diagrams of further optical amplifiers employing a ring laser cavity.
Figure 7:
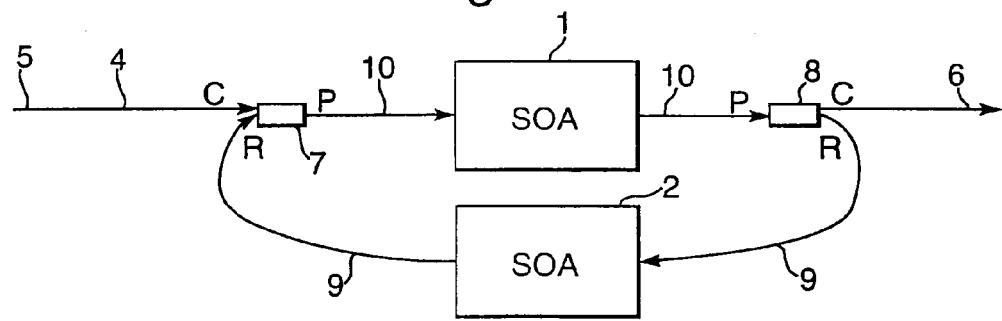

FIG. 6 illustrates a further optical amplifier which is identical to the optical amplifier of FIG. 3 except that the isolator 15 is arranged in the opposite direction within the optical path 9 to control the propagation direction of the lasing mode to be co-directional with the forward direction of the signal path 4. Similarly, FIG. 7 illustrates a further optical amplifier which is identical to the optical amplifier of FIG. 3 except that the isolator 15 is omitted. As a result, the lasing mode of the ring cavity propagates bi-directionally along the signal path 4. Thus, the provision of the isolator 15 allows the propagation direction of the lasing mode to be controlled. This in turn allows the optical power density to be equalized along the signal path 4 of the signal SOA and also gives control over the amount of ASE that is transmitted in the forward direction along the signal path 4.

Figure 8:
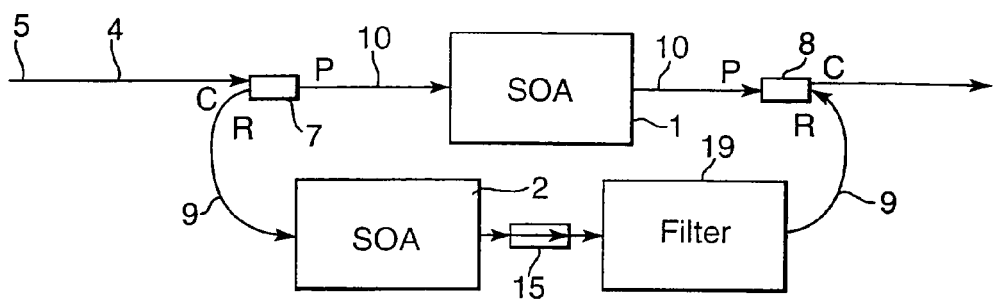
Figure 9:
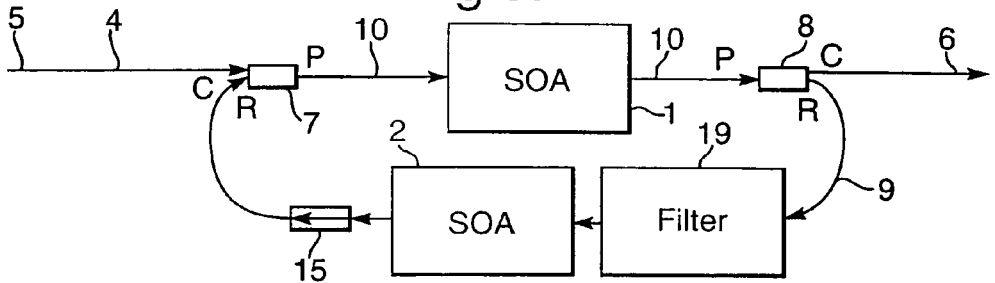
Figure 10:
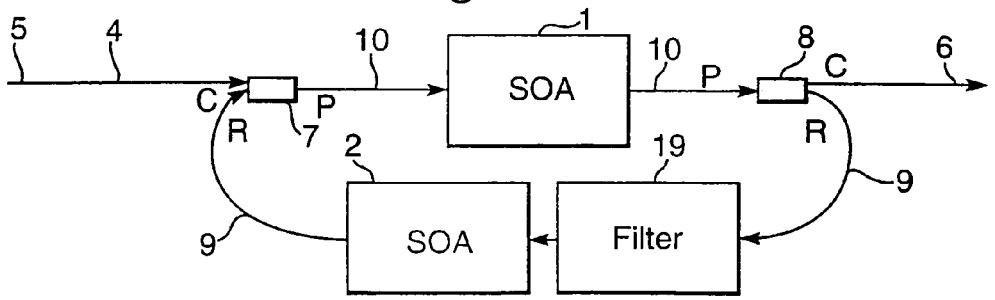

FIGS. 8 to 10 illustrate further optical amplifiers which are identical to the optical amplifiers of FIGS. 3, 6 and 7, respectively, except that a filter 19 is additionally provided in the optical path 9. The filter 19 acts as wavelength-dependent element to control the wavelength of the lasing mode. The filter 19 also has the advantage of limiting the amount of ASE that is coupled back into the signal SOA 1. Such ASE injected into the signal SOA 1 would otherwise compromise the signal-to-noise ratio within the signal path 1.

In the embodiments described above, the optical couplers 7 and 8 are WDM couplers. Such wavelength-selective couplers are preferable from the point of view of minimizing losses, since they prevent the lasing mode being coupled out of the laser cavity and similarly they prevent the signal being coupled out of the signal path 4. However, as an alternative, the optical couplers 7 and 8 may each be replaced by a wavelength-insensitive coupler, for example an appropriately weighted beam splitter which couples and decouples beams at all wavelengths in a predetermined ratio. Such a beam splitter is acceptable provided there is sufficient gain in the laser cavity to reach threshold even with the additional losses. Typically, the beam splitter will be arranged to couple 75% or more, typically 90%, of the incident light onto the signal path 4 outside the ring cavity to maintain high efficiency in the forward direction along the signal path 4. A wavelength-insensitive coupler provides a cost benefit, because such couplers are less expensive than wavelength-selective couplers such as WDM couplers.

FIG. 11 illustrates an optical amplifier in which a signal SOA 1 and the control SOA 2 are arranged in an optical circuit including a linear laser cavity containing the signal SOA 1 and the control SOA 2. The signal SOA 1 is arranged in a signal path 4 between an input 5 and an output 6. An optical coupler is arranged in the signal path 4 to couple an optical path 21 containing the control SOA 2 into the signal path 4. In the optical amplifier of FIG. 11, the optical coupler 20 is arranged on the output side of the signal SOA 1, but this is not essential. The optical coupler 20 takes the same form as the optical couplers 7 and 8 of the optical amplifiers employing a ring cavity described above with reference to FIGS. 2 and 6 to 10.

The optical path 21 is terminated by a reflector 22 so that the optical path 21 forms one end of a linear laser cavity. The reflector 22 may take any suitable form, for example a simple reflective layer, a loop mirror or a Bragg grating. Advantageously, the reflector 22 may be integrated into the semiconductor structure of the control SOA 2.

The opposite end of the laser cavity is formed by a reflector 23 arranged in the signal path 4 on the input side of the signal SOA 1. Therefore, a linear laser cavity is formed between the reflectors 22 and 23 by the optical path 21 together with the portion 24 of the signal path 4 between the optical coupler 20 and the reflector 23. The reflector 23 may be integrated within the semiconductor structure of the signal SOA 1.

The reflector 23 is preferably a wavelength-dependent reflector such as a Bragg grating. In this case reflections of the signal in the signal band 3 passing along the signal path 4 are minimized, and also the reflector 23 acts as a wavelength-dependent element to control the wavelength of the lasing mode 11. Thus it is not essential for the reflector 22 also to be wavelength-dependent, although this may be desirable. In addition, a filter 19 may optionally be provided in the signal path 21 as a wavelength-dependent element to control the wavelength of the laser mode in the same manner as in the optical amplifiers of FIGS. 8 to 10 employing a ring cavity.

The operation of the optical amplifier of FIG. 11 is the same as the operation of the optical amplifier of FIG. 3 except that the laser cavity is linear rather than being a ring.

Many other forms of linear cavity are envisaged. For example, FIG. 12 illustrates an optical amplifier which is identical to the optical amplifier of FIG. 11 except that to terminate the laser cavity, instead of the reflector 23 provided in the signal path 4, an optical coupler 25 is provided in the signal path 4 on the input side of the signal SOA 1 coupled to a further optical path 26 terminated by a further reflector 27.

FIG. 13 illustrates a further optical amplifier having an identical structure of the optical amplifier of FIG. 11 except that the components forming the laser cavity are arranged on opposite sides of the signal SOA 1. Therefore, the optical coupler 20 is arranged on the input side of the signal SOA 1 but coupled to an optical path 21 containing the same elements including the control SOA 2. Similarly, the reflector 23 is arranged in the signal path 4 on the output side of the signal SOA 2. Again, the reflector 23 could be replaced by an optical coupler 25, further optical path 26 and further reflector 27 as in the optical amplifier of FIG. 12.

As an example of an embodiment employing the second technique of providing the control SOA 2 with an insignificant gain in the signal band, FIG. 14 illustrates an optical amplifier in which both the signal SOA 1 and the control SOA 2 are arranged in the signal path 4. The control SOA 2 is arranged to have an insignificant gain in the desired signal band 3 to prevent the control SOA 2 amplifying signals passing along the signal path 4. However, the control SOA 2 has a significant gain at the wavelength of the lasing mode 11.

The optical amplifier of FIG. 14 further includes reflectors 28 arranged in the signal path 4 on opposite sides of the two SOAs 1 and 2 to form therebetween a linear laser cavity containing the signal SOA 1 and the control SOA 2. The reflectors 28 are preferably wavelength-dependent reflectors such as Bragg gratings in order to act as wavelength-dependent elements to control the wavelength of the lasing mode 11 and also to prevent reflection of the signal passing along the signal path 4.

As an example, the gain profiles of the signal SOA 1 and control SOA 2 are illustrated in FIG. 15 which is a graph of relative optical intensity (dB) against wavelength (nm). The gain profile of the signal SOA 1 is illustrated by the line 29 and has the same form as illustrated in FIG. 2 peaking around the desired signal band 3. The lasing mode 11 is arranged outside the desired signal band 3. The gain profiles of the control SOA 2 at different bias currents are shown by the lines 30. The gain profiles 30 of the control SOA 2 overlap the gain profile 29 of the signal SOA 1 and are significant at the wavelength of the lasing mode 11. However, the gain profiles 30 of the control SOA 2 decrease so that the gain of the control SOA 2 is insignificant in the desired signal band 3. Typically in the desired signal band 3, the gain of the control SOA 2 is less than 1%, preferably less 0.1% of the gain of the signal SOA 1, so that the amplification of the signal by the control SOA 2 is not significant.

The optical amplifier of FIG. 14 operates in exactly the same manner as the optical amplifiers of the first type described above. In particular, as the gain of the control SOA 2 is significant at the wavelength of the lasing mode, changing the bias current to the control SOA 2 controls the clamped gain of the signal SOA 1 in exactly the same manner. The main difference is that the control SOA 2 is prevented from amplifying signals by having an insignificant gain in the predetermined signal band 3, instead of by being arranged outside the signal path 4. This allows the control SOA 2 to be arranged in the signal path 4 which has the advantage of being a simpler arrangement. For example, optical couplers are not essential.

Figure 16:
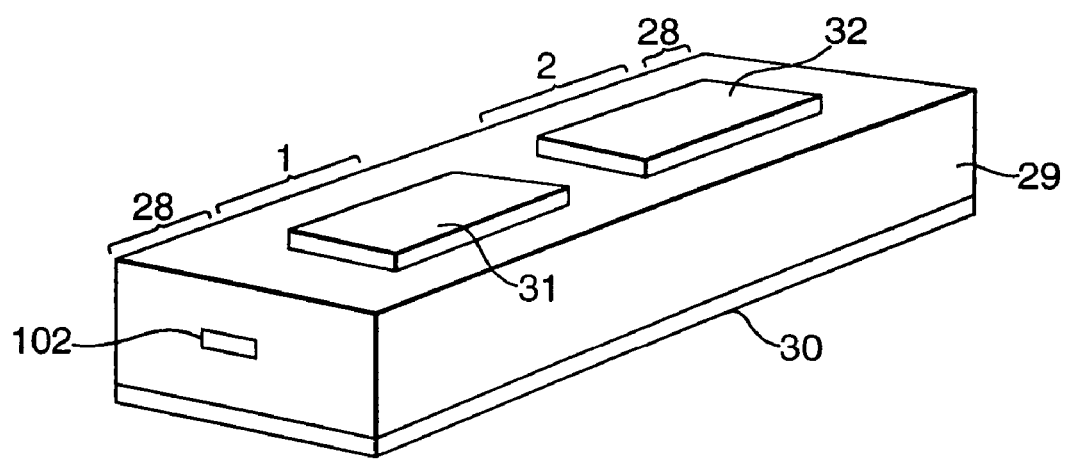
FIG. 16 is a perspective view of an optical amplifier integrated in a single semiconductor chip.

To form an embodiment of a second type, the components of the optical amplifier of FIG. 14, including both the signal SOA 1 and the control SOA 2, and optionally also the reflectors 28, may be integrated together in a single semiconductor chip 29, as illustrated in FIG. 16.

The optical amplifier of FIG. 16 otherwise has the construction illustrated schematically in FIG. 14. The above description of both the properties and the use of the optical amplifier of FIG. 14 applies equally to the optical amplifier of FIG. 16, although for brevity that description will not be repeated here.

The advantage of the optical amplifier of FIG. 16 is that it allows the entire variable-gain-clamped optical amplifier to be integrated in a single semiconductor chip.

The semiconductor chip 29 of FIG. 16 may have the same construction along its length as illustrated in FIG. 1 and described above. Light passes along the waveguide formed by the active layer 102 passing along the entire length of the semiconductor chip 29. Different portions of the active layer 102 along the length of the semiconductor chip 29 constitute the signal SOA 1 and the control SOA 2.

To allow independent control of the control SOA 1 and the signal SOA 2, the upper contact is separated into two electrically isolated contacts 31 and 32, the lower contact 30 being continuous along the length of the semiconductor chip 29. In use, separate drive currents are independently supplied to the upper contacts 31 and 32 causing respective drive currents to flow to the lower contact 30 through respective portions of the active layer 102 underneath the respective upper contacts 31 and 32, which respective portions of the layer 102 are thus independently controllable.

The reflectors 28 may be integrated in to the semiconductor chip 29 beyond the signal SOA 1 and the control SOA 2. Such the reflectors 28 may be of conventional construction. Alternatively, the reflectors 28 may be formed by separate components outside the semiconductor chip 29.

To provide appropriate properties to the portions of the active layer 102 forming the signal SOA 1 and the control SOA 2, it is possible to use conventional manufacturing techniques which selectively modify different regions of the semiconductor chip. Such techniques allow the signal SOA 1 and/or the control SOA 2 to have a quantum well structure. The energy of the confined states of a semiconductor quantum well are affected by the width of the quantum well, as well as the band gap of the well material and the barrier material.

In particular, the following types of manufacturing method which are known in themselves for providing a semiconductor chip with different functionality in different regions may be applied to manufacture the optical amplifier:

Shadow-masked growth: This technique is described for example in "Multiwavelength InGaAs/InGaAsP Strained-Layer MQW-Laser Array Using Shadow-Masked Growth", IEEE Photonics Technology Letters, 4, 524–526 (1992). When layers are grown on a contoured wafer certain areas are partially hidden from the material sources in the growth chamber and hence the thickness of each of the layers varies across the wafer. Therefore the bandgap is varied according to the patterning of the mask layer.

Diffusion enhanced growth: This technique is described for example in "Selective MOVPE growth of InGaAsP and InGaAs using TBA and TBP", Y. Sakata et al, Seventh International Conference on Indium Phosphide and Related Materials Proceedings, Pages 839–942 (1995). It is similar to shadow mask regrowth except that the growth is enhanced when atoms are weakly attracted to the mask layer, and can diffuse around on this surface to the openings in the mask layer. Growth in each window area is then enhanced due the edges so narrow openings are more strongly enhanced making the layers that form the quantum wells thicker in these regions. Quantum-Well Intermixing: This technique is described for example in "Area Selectivity of InGaAsP-InP Multiquantum-Well Intermixing by Impurity-Free Vacancy Diffusion", Sang Kee Si et al. IEEE Journal of Selected Topics in Quantum Electronics, 4,619–623 (1998). This is a technique where a material is grown onto the semiconductor wafer that promotes disordering of the material. The layers that form the quantum wells and the barriers are disordered and the energy of the ground state of the quantum well is typically increased.

In the embodiments described above, the laser cavity extends longitudinally along the signal path of the signal SOA 1. As a result, the laser cavity is very long as compared to the wavelength of the signal band. Consequently the phase condition for the lasing mode, that the net round-trip phase is zero is met at closely spaced intervals, and so the phase condition is not an important design parameter.

There will now be described a third type of embodiment in which the laser cavity extends transversely across the signal path of a semiconductor optical amplifier, in particular vertically, that is perpendicular to the layered structure of the signal SOA. In this type of embodiment, the entire optical amplifier is integrated into a single semiconductor chip. As a result, the size of the laser cavity becomes short as compared to the length of the laser cavity. Consequently, the phase condition that the net round-trip phase is zero necessary to establish the laser mode becomes a significant design parameter.

Such short-cavity devices have particular advantages, because the natural relaxation oscillation frequency of these lasers is high, typically exceeding the data rate in optical networks, in contrast to the embodiments described above in which the cavity lengths make this almost impossible to achieve. The gain clamping of such short-cavity devices reacts very quickly, in fact faster than the bit rate, so that the gain is clamped dynamically even when the signal power is of the same order of magnitude as, or perhaps even larger than, the power in the lasing mode used to clamp the amplification. Thus these devices are more efficient and can operate closer to their saturation power.

Figure 17:
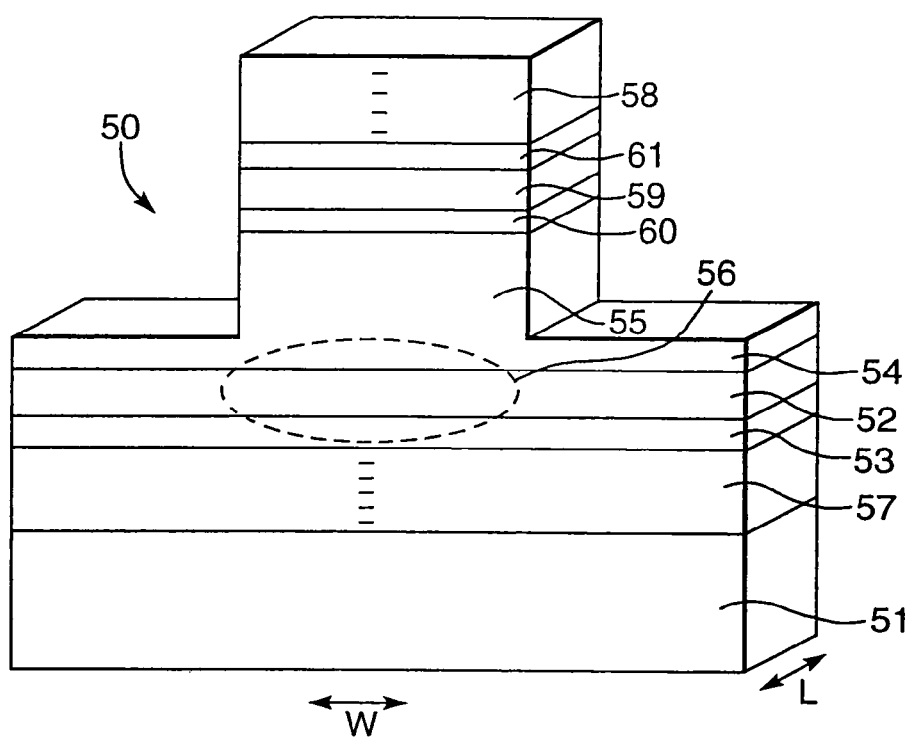
FIG. 17 is a sectional view of a portion of a first optical amplifier having a laser cavity transverse to the signal path.

FIG. 17 illustrates a portion of an optical amplifier 50 which is integrated in a single semiconductor chip with a layered structure and has the same cross-section along its entire length L perpendicular to the plane in which the section is taken. The optical amplifier 50 may be made from material such as InGaAsP, or other suitable semiconductor materials, in a conventional manner.

The layered structure of the optical amplifier 50 is built up from a substrate 51 which also constitutes a contact of n-type material.

The optical amplifier 50 has a first layer 52 of active material which constitutes a signal active layer 52. The signal active layer 52 may be formed from a bulk material or may have a quantum well structure.

Below and above the signal active layer 52 are respective cladding layers 53 and 54 to provide confinement of light in the vertical direction and to form a separate-confinement heterostructure (SCH).

The upper cladding layer 54 is formed with a ridge 55 to provide lateral confinement of light horizontally across the width W of the optical amplifier 50, that is parallel to the layered structure and perpendicular to the length L of the optical amplifier 50. The ridge 55 in combination with the cladding layers 53 and 54 provides a waveguide for a laterally guided mode in the approximate position shown by the dotted line 56. In use, the laterally guided mode 56 is the signal which is amplified by the material of the signal active layer 52 as it passes along the length L of the optical amplifier 50.

To provide a vertical laser cavity, the optical amplifier additionally includes a pair of distributed Bragg reflectors 57 and 58 on either side of the signal active layer 52. In particular, a lower distributed Bragg reflector 57 is provided between the substrate 51 and the lower cladding layer 53. The upper distributed Bragg reflector 58 is formed on the ridge 55 of the upper cladding layer 54 with other layers interposed therebetween which will be further described below.

The distributed Bragg reflectors 57 and 58 are formed by alternate layers to provide a periodic structure repeating vertically. The layers of the distributed Bragg reflectors 57 ad 58 extend along the length of the optical amplifier 50 to reflect light vertically, thereby forming a vertical laser cavity therebetween.

Accordingly, as far as the vertical laser cavity is concerned, the optical amplifier 50 has a similar structure to a known Vertical Cavity Surface Emitting Laser (VCSEL) type of laser, for example as disclosed in "Tunable VCSEL", C. J. Chang-Hasnain, IEEE J. Select. Topics Quantum Electron, 6,978–987 (2000). Accordingly, the structure of such known VCSELs may be applied to the vertical laser cavity of optical amplifiers in accordance with the present invention.

Interposed between the upper cladding layer 54 and the upper distributed Bragg reflector 58 is a second layer 59 of active material which constitutes a control active layer 59. The control active layer 59 is outside the waveguide 56 formed along the signal active layer 52. As an alternative, the control signal layer 59 could be arranged below, instead of above, the signal active layer 52.

To provide independent control of the control active layer 59 and the signal active layer 52, a first contact layer 60, of p-type material, is disposed between the two active layers 52 and 59, in particular between the upper cladding layer 54 and the control active layer 59. Also, a second contact layer 61, of n-type material, is arranged above the control active-layer 59. Therefore, the bias current through the control active layer 59 may be controlled by applying a voltage between the first contact layer 60 and the second contact layer 61, whereas the bias current across the signal-active layer 52 may be controlled by applying a voltage between the first contact 60 and the substrate 51 which also constitutes a contact.

In use, the lasing action of the laser cavity clamps the total gain of the signal active layer 52 and the control active layer 59. Therefore, the signal active layer 52 constitutes the signal active region and the control active layer 59 constitutes the control active region. The optical amplifier 50 of FIG. 17 operates in the same manner as the optical amplifiers described above with the signal active layer 52 corresponding to the signal SOA 1 and the control active layer 59 corresponding to the control SOA 2.

In particular, the lasing action clamps the total gain of the signal active layer 52 and the control active layer 59 at the lasing wavelength at that gain where the lasing threshold is reached, in other words where the total gain equals the total losses of the laser cavity. Thus the gain of the signal active layer 52 in the signal band is also clamped. In use, the gain of the control active layer 59 is controlled by varying the bias current supplied thereto. The lasing action of the laser cavity causes the clamped gain of the signal active layer 52 at the lasing wavelength to vary oppositely to the gain of the control active layer 59, so that the total gain of the signal active layer 52 and the control active layer 59 remains constant. The clamped gain of the signal active layer 52 imposed on amplification of signals in the signal band is correspondingly varied. In other words, control of the control active layer 59 allows the clamped gain of the signal active layer 52 in the signal band to be varied without variation of the bias current supplied across the signal active layer 52.

This maximizes the saturation output power of the signal active layer 52, as compared to a corresponding changing in gain achieved by varying the bias current supplied to the signal active layer 52. Changing the bias current supplied to the control of the layer 59 would affect the saturation output power of the control active layer 59, if light were passed therealong in the manner of an SOA, but this does not limit the saturation output power of the signal active layer 52.

In normal use, the bias current supplied to the signal active layer 52 is fixed, usually at its maximum value in order to maximize saturation output power.

In fact, the gain of the signal active layer 52 may be varied into loss by controlling the bias current supplied to the control active layer 59 so as to raise the gain of the control active layer 59 above the laser threshold of the laser cavity. This is advantageous because there are many circumstances in telecommunications networks where it is desirable to reduce the level of a data signal, for example to meet the operating conditions of a particular device. However, such a linear reduction in power is not possible with a simple SOA.

The graph of FIG. 5 applied equally to the optical amplifier 50 of FIG. 17, replacing references to the signal SOA 1 by references to the signal active layer 52 and replacing references to the control SOA 2 by references to the control active layer 59.

The optical amplifier 50 of FIG. 17 may be manufactured by conventional growth techniques, for example epitaxy.

Figure 18:
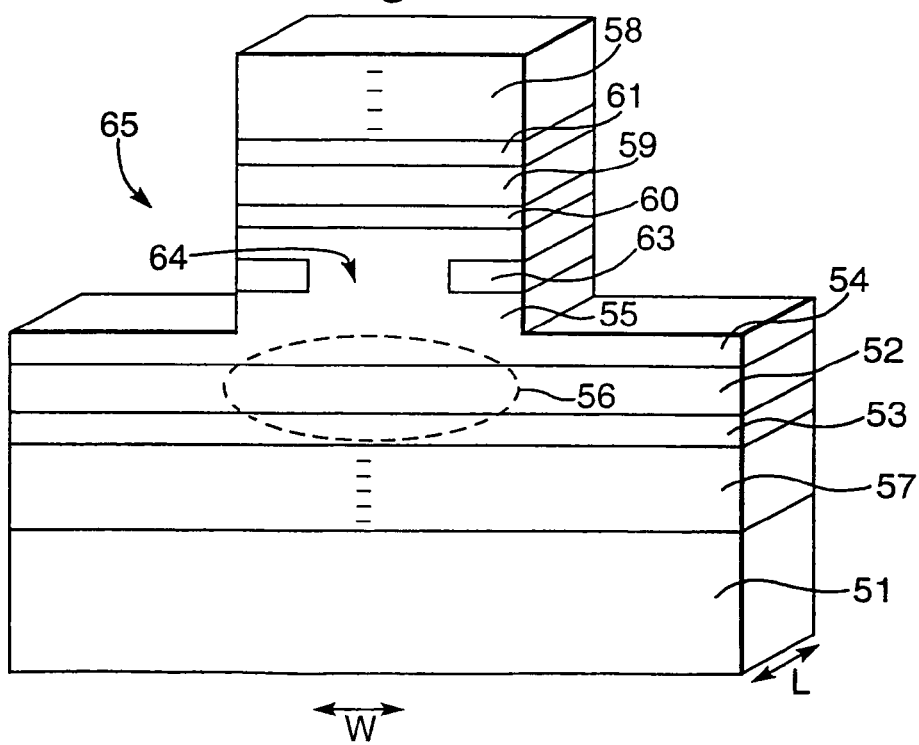
FIG. 18 is a sectional view of a portion of a second optical amplifier having a laser cavity transverse to the signal path.

FIG. 18 illustrates a further optical amplifier 65 which has the same structure as optical amplifier 50 of FIG. 17 except for the additional provision of an oxide confinement layer 63. The oxide confinement layer 63 is provided as a layer within the ridge 55 of the upper cladding layer 54, although it could alternatively be provided in one of the distributed Bragg reflectors 58 close to the active layer 52. The oxide confinement layer 63 has a central aperture 64 which provides for lateral confinement of the guided mode 56 and also provides for optical confinement of the vertical laser mode. This ensures that the laser cavity has a single mode. The oxide confinement layer 63 also provides current confinement to ensure that the optical amplifier 50 operates efficiently. The oxide confinement layer 63 may be formed with the central aperture 64 by providing an unoxidized layer extending across the entire width of the ridge 55 and subsequently exposing the edges of that layer to oxidize them and create the oxide confinement layer 63 with the aperture 64 remaining unoxidized.

The optical amplifier 65 of FIG. 18 is used in the same manner as the optical amplifier 50 of FIG. 17.

We claim:

1. An optical amplifier comprising:
    a signal semiconductor optical amplifier having a waveguide, forming at least part of a signal path between an input and an output, extending along a signal active region for amplification of a signal;
    a control active region of semiconductor material having a gain which is controllable independently from the gain of the signal active region; and
    a laser cavity containing both the signal active region and the control active region and being capable of clamping the gain of the signal active region,
    wherein the control active region is arranged not to amplify a signal in the signal path within a predetermined signal band.

2. An optical amplifier according to claim 1, wherein the control active region is the active region of a control semiconductor optical amplifier formed separately from the signal semiconductor optical amplifier.

3. An optical amplifier according to claim 2, wherein the control semiconductor optical amplifier is outside the signal path so that it does not amplify a signal in the signal path.

4. An optical amplifier according to claim 3, wherein the laser cavity extends longitudinally along the signal path.

5. An optical amplifier according to claim 4, wherein the laser cavity is a ring cavity.

6. An optical amplifier according to claim 5, wherein the ring cavity includes an isolator which controls the propagation direction of the lasing mode in the laser cavity with respect to the signal path.

7. An optical amplifier according to claim 5, further comprising a pair of optical couplers in the signal path on the input side and output side, respectively, of the signal semiconductor optical amplifier coupling the ring laser cavity into the signal path.

8. An optical amplifier according to claim 7, wherein the pair of optical couplers couple respective ends of an optical path which contains the control semiconductor optical amplifier and which, together with the portion of the signal path between the pair of optical couplers, forms the ring laser cavity.

9. An optical amplifier according to claim 4, wherein the laser cavity is a linear cavity.

10. An optical amplifier according to claim 9, further comprising an optical coupler in the signal path coupling the linear laser cavity into the signal path.

11. An optical amplifier according to claim 10, wherein the optical coupler couples an end of an optical path which contains the control semiconductor optical amplifier and which is terminated by a reflector to form one end of the linear laser cavity.

12. An optical amplifier according to claim 11, wherein the other end of the linear laser cavity is terminated by a reflector arranged in the signal path.

13. An optical amplifier according to claim 11, wherein the other end of the linear laser cavity is formed by a second optical coupler coupled in the signal path, on the opposite side of the control semiconductor optical amplifier from the first mentioned optical coupler, to a second optical path terminated by a reflector.

14. An optical amplifier according to claim 7 wherein each optical coupler is a wavelength division multiplexing coupler or other wavelength-selective coupler.

15. An optical amplifier according to claim 7, wherein each optical coupler is a wavelength-insensitive coupler.

16. An optical amplifier according to claim 1, wherein the signal active region and the control active region are different regions of the same semiconductor chip, said waveguide extending along both the signal active region and the control active region.

17. An optical amplifier according to claim 1, wherein the control active region is integrated outside the waveguide in the same semiconductor chip as the signal semiconductor optical amplifier.

18. An optical amplifier according to claim 17, wherein the laser cavity extends transversely to the waveguide.

19. An optical amplifier according to claim 18, wherein the laser cavity extends perpendicular to the layered structure of the semiconductor chip.

20. A semiconductor optical amplifier according to claim 18, wherein the signal and control active regions are formed by respective layers of active material and the laser cavity extends perpendicular to the layers.

21. A semiconductor optical amplifier according to claim 20, further comprising contact layers on both sides of the signal and control active layers for independently controlling the bias current across each active layer.

22. An optical amplifier according to claim 1, wherein the laser cavity has a lasing mode at a wavelength outside the predetermined signal band.

23. An optical amplifier according to claim 22, wherein the laser cavity includes a wavelength-dependent element to control the wavelength of the lasing mode.

24. An optical amplifier according to claim 23, wherein the wavelength-dependent element is a filter in the laser cavity outside the signal path.

25. An optical amplifier according to claim 23, wherein the wavelength-dependent element is a wavelength-selective coupler.

26. An optical amplifier according to claim 1, wherein the control active region has an insignificant gain in the predetermined signal band so that it does not amplify a signal in the predetermined signal band.

27. An optical amplifier according to claim 26, wherein the control active region is in the signal path.

28. An optical amplifier according to claim 27, wherein the laser cavity is formed between reflectors arranged in the signal path.

29. A method of controlling an optical amplifier which optical amplifier comprises:
   a signal semiconductor optical amplifier having a waveguide, forming at least part of a signal path between an input and an output, extending along a signal active region for amplification of a signal;
   a control active region of semiconductor material having a gain which is controllable independently from the gain of the signal active region;
   a laser cavity containing both the signal active region and the control active region, and being capable of clamping the gain of the signal active region; and
   wherein the control active region is arranged not to amplify a signal in the signal path within a predetermined signal band, the method comprising controlling the gain of the control active region whereby the gain on the signal path is controlled.

30. A method according to claim 29, wherein the gain of the control active region is controlled by controlling the bias current to the control active region.

* * * * *